United States Patent
Cheng

(10) Patent No.: US 9,563,550 B2
(45) Date of Patent: Feb. 7, 2017

(54) FLASH STORAGE DEVICE AND CONTROL METHOD FOR FLASH MEMORY

(71) Applicant: Silicon Motion, Inc., Jhubei, Hsinchu County (TW)

(72) Inventor: Chang-Kai Cheng, Hsinchu (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 427 days.

(21) Appl. No.: 13/970,779

(22) Filed: Aug. 20, 2013

(65) Prior Publication Data

US 2014/0068158 A1 Mar. 6, 2014

(30) Foreign Application Priority Data

Sep. 5, 2012 (TW) .............................. 101132292 A

(51) Int. Cl.
*G06F 12/00* (2006.01)
*G06F 13/00* (2006.01)
(Continued)

(52) U.S. Cl.
CPC .......... *G06F 12/0246* (2013.01); *G11C 29/82* (2013.01); *G06F 2212/7201* (2013.01); *G06F 2212/7204* (2013.01); *G11C 16/349* (2013.01)

(58) Field of Classification Search
CPC .................... G06F 12/0246; G06F 2212/7201; G06F 2212/7204
(Continued)

(56) References Cited

U.S. PATENT DOCUMENTS

| 4,763,244 | A | * | 8/1988 | Moyer | ................ | G06F 12/1027 |
| | | | | | | 711/206 |
| 4,890,223 | A | * | 12/1989 | Cruess | ................ | G06F 12/1036 |
| | | | | | | 711/164 |

(Continued)

FOREIGN PATENT DOCUMENTS

| CN | 102483717 A | 5/2012 |
| TW | 200707193 | 2/2007 |

(Continued)

OTHER PUBLICATIONS

English language machine translation of TW 200707193 (published Feb. 16, 2007).

(Continued)

*Primary Examiner* — Sheng-Jen Tsai
(74) *Attorney, Agent, or Firm* — McClure, Qualey & Rodack, LLP

(57) ABSTRACT

A FLASH memory is used in data storage and is further stored with a logical-to-physical address mapping table and a write protection mapping table. The write protection mapping table shows the write protection statuses of the different logical addresses. In accordance with logical addresses issued via a dynamic capacity management command from a host, a controller of the data storage device modifies the logical-to-physical address mapping table to break the logical-to-physical mapping relationship of the issued logical addresses. Further, the controller asserts a flag, corresponding to the issued logical addresses, in the write protection mapping table, to a write protected mode. According to a change in the amount of write-protected flags of the write protection mapping table, the controller adjusts an end-of-life judgment value of the FLASH memory and thereby a lifespan of the FLASH memory is prolonged.

10 Claims, 3 Drawing Sheets

(51) Int. Cl.
*G06F 12/02* (2006.01)
*G11C 29/00* (2006.01)
*G11C 16/34* (2006.01)

(58) Field of Classification Search
USPC .................................................... 711/103
See application file for complete search history.

(56) References Cited

U.S. PATENT DOCUMENTS

| | | | | |
|---|---|---|---|---|
| 5,623,636 A * | 4/1997 | Revilla | ............... | G06F 12/1441 711/163 |
| 5,666,509 A * | 9/1997 | McCarthy | ............. | G06F 9/3861 711/202 |
| 6,301,344 B1 * | 10/2001 | Meyer | ..................... | H04M 1/18 379/143 |
| 6,434,103 B1 * | 8/2002 | Shitara | .............. | G06F 17/30067 369/30.05 |
| 6,594,744 B1 * | 7/2003 | Humlicek | ............. | G06F 3/0601 707/999.202 |
| 7,596,656 B2 * | 9/2009 | Elhamias | ............. | G06F 12/0246 711/103 |
| 8,484,414 B2 * | 7/2013 | Sugimoto | ............. | G06F 3/0616 711/103 |
| 8,688,894 B2 * | 4/2014 | Kuehne | ............... | G06F 12/0246 711/103 |
| 8,745,357 B2 * | 6/2014 | Tucek | ................. | G06F 12/0246 711/103 |
| 2004/0177216 A1 * | 9/2004 | Asari | ................... | G06F 12/0246 711/103 |
| 2004/0202024 A1 * | 10/2004 | Shinagawa | ............ | G11C 16/16 365/185.29 |
| 2006/0069852 A1 * | 3/2006 | Aasheim | ............. | G06F 12/0246 711/103 |
| 2006/0101081 A1 * | 5/2006 | Lin | ................... | G06F 17/30362 |
| 2007/0143571 A1 * | 6/2007 | Sinclair | ................ | G06F 3/0605 711/203 |
| 2007/0150645 A1 * | 6/2007 | Chandramouli | .... | G06F 11/1441 711/103 |
| 2007/0186065 A1 * | 8/2007 | Lee | ....................... | G06F 3/0616 711/159 |
| 2007/0203960 A1 * | 8/2007 | Guo | ..................... | G06F 12/0269 |
| 2007/0266200 A1 * | 11/2007 | Gorobets | ............. | G06F 11/008 711/103 |
| 2008/0082725 A1 * | 4/2008 | Elhamias | ............ | G06F 12/0246 711/103 |
| 2008/0239811 A1 * | 10/2008 | Tanaka | ................ | G11C 11/5621 365/185.11 |
| 2008/0276036 A1 * | 11/2008 | Van Acht | ............ | G06F 12/0246 711/103 |
| 2009/0271562 A1 * | 10/2009 | Sinclair | ............... | G06F 12/0246 711/103 |
| 2010/0172179 A1 * | 7/2010 | Gorobets | ............ | G06F 12/0246 365/185.09 |
| 2010/0174851 A1 * | 7/2010 | Leibowitz | ............. | G06F 3/0616 711/103 |
| 2010/0211737 A1 * | 8/2010 | Flynn | .................... | G06F 3/0616 711/114 |
| 2010/0235605 A1 * | 9/2010 | Perry | .................. | G06F 12/0246 711/170 |
| 2011/0066818 A1 * | 3/2011 | Yu | .......................... | G06F 21/10 711/162 |
| 2011/0078363 A1 * | 3/2011 | Yeh | ..................... | G06F 12/0246 711/103 |
| 2011/0145480 A1 * | 6/2011 | Ng | .......................... | G06F 3/061 711/103 |
| 2011/0145483 A1 | 6/2011 | Sudo | | |
| 2011/0216592 A1 * | 9/2011 | Nagashima | ............ | G11C 16/04 365/185.11 |
| 2011/0231610 A1 * | 9/2011 | Yano | ................... | G06F 12/0246 711/118 |
| 2011/0264868 A1 * | 10/2011 | Takata | .................. | G06F 3/0614 711/154 |
| 2012/0047316 A1 * | 2/2012 | Post | ..................... | G06F 3/0608 711/103 |
| 2012/0060012 A1 * | 3/2012 | Olszewski | .......... | G06F 12/1009 711/171 |
| 2012/0089805 A1 * | 4/2012 | Liu | ....................... | G06F 3/0643 711/173 |
| 2012/0246393 A1 * | 9/2012 | Hashimoto | .......... | G06F 12/0246 711/103 |
| 2012/0303868 A1 * | 11/2012 | Tucek | ................. | G06F 12/0238 711/103 |
| 2012/0317346 A1 * | 12/2012 | Yeh | ..................... | G06F 12/0246 711/103 |
| 2013/0060989 A1 * | 3/2013 | Aune | ................... | G06F 12/0246 711/103 |
| 2013/0332653 A1 * | 12/2013 | Yeh | ..................... | G06F 12/0246 711/103 |
| 2014/0173268 A1 * | 6/2014 | Hashimoto | .......... | G06F 11/0754 713/2 |

FOREIGN PATENT DOCUMENTS

| | | |
|---|---|---|
| TW | 200821827 | 5/2008 |
| TW | 201118569 | 6/2011 |
| TW | 201122812 | 7/2011 |
| TW | 201122816 | 7/2011 |

OTHER PUBLICATIONS

English language machine translation of TW 200821827 (published May 16, 2008).
English language translation of abstract of TW 201118569 (published Jun. 1, 2011).
English language translation of abstract of TW 201122812 (published Jul. 1, 2011).
English language translation of abstract of TW 201122816 (published Jul. 1, 2011).

* cited by examiner

FLASH STORAGE DEVICE AND CONTROL METHOD FOR FLASH MEMORY

CROSS REFERENCE TO RELATED APPLICATIONS

This Application claims priority of Taiwan Patent Application No. 101132292, filed on Sep. 5, 2012, the entirety of which is incorporated by reference herein.

BACKGROUND OF THE INVENTION

Field of the Invention

The present invention relates to data storage devices, and in particular, relates to FLASH memory control methods.

Description of the Related Art

A FLASH memory is a general non-volatile storage device that is electrically erased and programmed.

A NAND FLASH, for example, is primarily used in memory cards, USB FLASH devices, solid-state drives, and so on. In a multi-chip package, a NAND FLASH and a controller chip may be packaged into a single package as an eMMC (embedded MultiMediaCard).

In a NAND FLASH, the storage array comprises a plurality of blocks and each block comprises a plurality of pages. Some blocks are allocated to be data blocks, and, the blocks waiting for allocation may be spare blocks. Depending on usage situations, some of the storage space may be damaged. The damaged blocks should not be utilized anymore. Thus, the available number of spare blocks may decrease. When the total amount of spare blocks is less than a threshold amount, the FLASH memory should be tagged as: End-of-Life. If tagged, no more write operations is allowed and the FLASH memory is switched to a read-only mode.

It is an important topic in the field to prolong the lifespan of a FLASH memory for normal read/write operations.

BRIEF SUMMARY OF THE INVENTION

A data storage device and a FLASH memory control method are disclosed.

A data storage device in accordance with an exemplary embodiment of the invention comprises a FLASH memory and a controller. In addition for data storage, the FLASH memory is further stored with a logical-to-physical address mapping table and a write protection mapping table. The write protection mapping table shows the write protection statuses of the different logical addresses. According to logical addresses issued via a dynamic capacity management request from a host, the controller modifies the logical-to-physical address mapping table to break the logical-to-physical mapping relationship of the issued logical addresses. Further, the controller asserts a flag, corresponding to the issued logical addresses, in the write protection mapping table, to a write protected mode and, accordingly, modifies an end-of-life judgment value to prolong the lifespan of the FLASH memory. In this manner, the FLASH memory remains writable.

A FLASH memory control method in accordance with an exemplary embodiment of the invention comprises the following steps: modifying a logical-to-physical address mapping table in accordance with logical addresses issued via a dynamic capacity management request from a host, to break the logical-to-physical mapping relationship of the issued logical addresses; asserting a flag, corresponding to the issued logical addresses, in a write protection mapping table, to a write protected mode, wherein the write protection mapping table is recorded with flags showing the write protection statuses of the different logical addresses; and, adjusting an end-of-life judgment value based on the status change of the flags of the write protection mapping table to thereby prolong the lifespan of the FLASH memory such that the FLASH memory remains writable.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
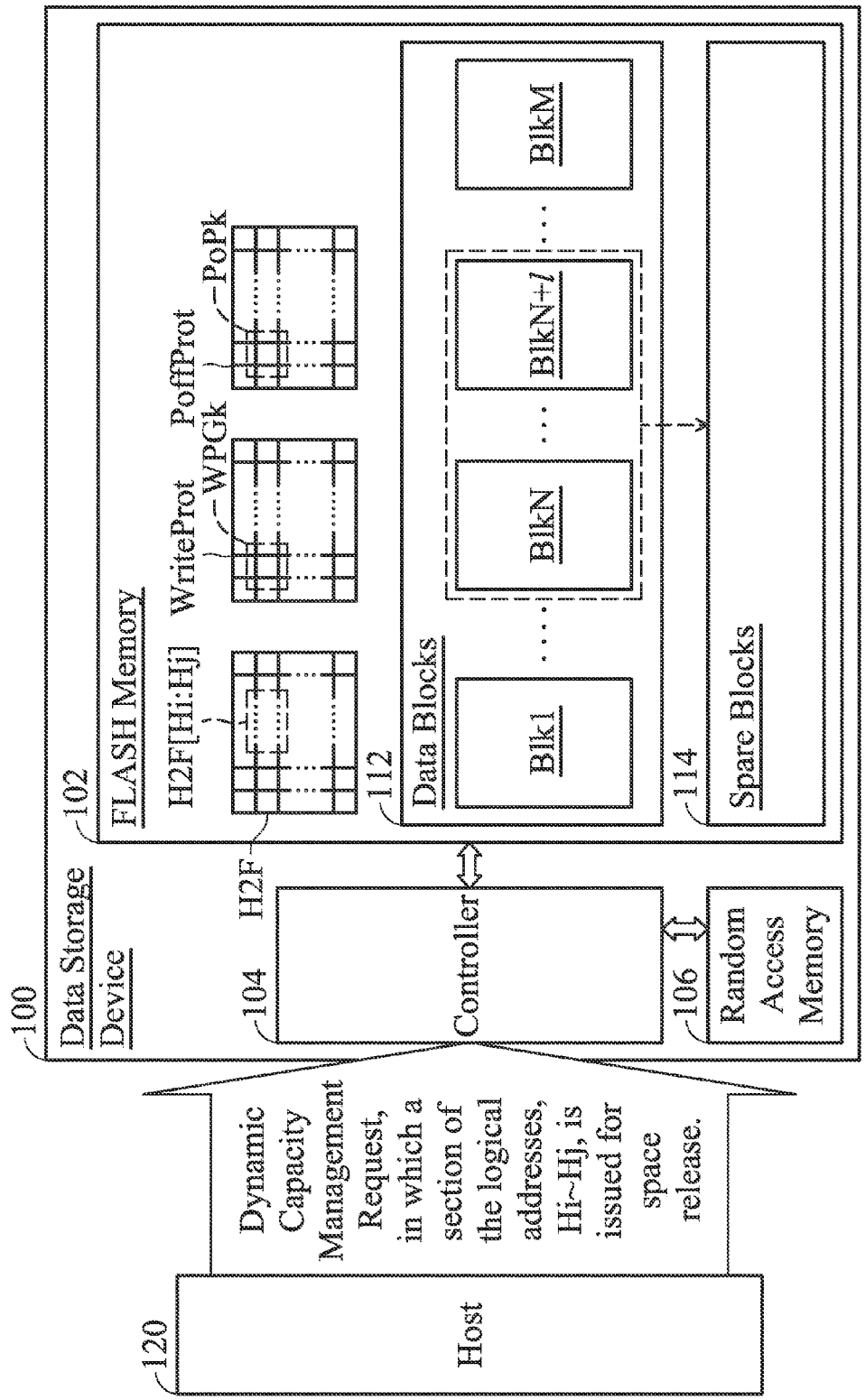
FIG. 1 is a block diagram depicting a data storage device 100 in accordance with an exemplary embodiment of the invention.

FIG. 1 is a block diagram depicting a data storage device 100 in accordance with an exemplary embodiment of the invention.

The data storage device 100 comprises a FLASH memory 102, a controller 104 and a random-access memory (RAM) 106. The storage space of the FLASH memory 102 may be divided into blocks. To release the space of an in-use block for gaining a spare block to be allocated for utilization, an erase operation has to be performed on the entire block. In FIG. 1, the data blocks 112 include blocks Blk1 . . . BlkN . . . BlkN+1 . . . BlkM. The spare blocks 114 are free for allocation. Further, several blocks are allocated for storing mapping tables, including a logical-to-physical address mapping table H2F, a write protection mapping table WriteProt and a power-off protection mapping table PoffProt. The power-off protection mapping table PoffProt is optional and is discussed later. The logical-to-physical address mapping table H2F shows how the different logical addresses map to the physical space. In an exemplary embodiment, each logical index maps to one super-page (a collection of a plurality of pages) of the physical space. In the write protection mapping table WriteProt, whether a logical address is write protected or not, is indicated by a flag corresponding thereto. In an exemplary embodiment, each index of the write protection mapping table WriteProt maps to several super-pages. The controller 104 operates the FLASH memory 102 to respond to the commands issued from a host 120. The random access memory 106 is operative to temporarily store the information that the controller 104 generates during operation. For example, the controller 104 may utilize the random access memory 106 to dynamically refresh the tables H2F, WriteProt and PoffProt. The tables H2F, WriteProt and PoffProt dynamically refreshed in the random access memory 106 may be uploaded to the FLASH memory 102 altogether at a proper time.

In an exemplary embodiment, the data storage device 100 may be an embedded MultiMediaCard (eMMC). The host 120 may be a mobile communication device or a tablet PC and so on, which is equipped with the eMMC. The host 120 is configured to issue a request for dynamic capacity management. Via the dynamic capacity management request, a section of the logical addresses, Hi~Hj, may be issued for space release. Referring to FIG. 1, the issued logical addresses Hi~Hj map to the blocks BlkN~BlkN+l which are stored with system information of the host 120 rather than user data. The controller 104 may modify the logical-to-physical address mapping table H2F to break the logical-to-physical mapping relationship between the issued logical addresses Hi~Hj and the physical blocks BlkN~BlkN+l. As shown, the contents of H2F[Hi:Hj] of the logical-to-physical address mapping table H2F are modified. In this manner, the blocks BlkN~BlkN+l do not map to any logical address and may be released as spare blocks 114. Further, the controller 104 may modify the write protection mapping table WriteProt to assert the flag WPGk corresponding to the issued logical addresses Hi~Hj, to a write protected mode, and thereby the issued logical addresses Hi~Hj is write protected and no more space allocation is required for the issued logical addresses Hi~Hj. The space utilization of the FLASH memory 102, therefore, is more flexible. Accordingly, the controller 104 may correct an end-of-life judgment value, EOL_para, of the FLASH memory 102, and thereby write operations may still be permitted on the FLASH memory 102. According to the disclosure, the lifespan of the FLASH memory 102 may be prolonged.

In an exemplary embodiment of the invention, the end-of-life judgment value EOL_para is positively related to the total amount of spare blocks of the FLASH memory 102. By the controller 104, the end-of-life judgment value EOL_para may be changed in accordance with the total amount of write protected flags within the write protection mapping table WriteProt. For example, the end-of-life judgment value EOL_para may represent the total amount of spare and non-damaged blocks in the FLASH memory 102. When the end-of-life judgment value EOL_para is lower than a threshold value, the controller 104 switches the FLASH memory 102 to an end-of-life status; otherwise, the controller 104 determines that the FLASH memory 102 should remain writable and not be switched to the end-of-life status yet. When the write protection mapping table WriteProt is scanned and it shows that there is a number, Release_Blk, of blocks which are released as spare blocks by the disclosed techniques, the end-of-life judgment value EOL_para is refreshed by adding the number Release_Blk. The increased end-of-life judgment value EOL_para may result in prolonging the lifespan of the FLASH memory. Note that the number Release_Blk may be obtained by other ways. Instead of being obtained from scanning the flag statuses of the write protection mapping table WriteProt, the number Release_Blk may be a default factor stored in the FLASH memory 102. Every time the write protection mapping table WriteProt has a flag asserted to the write protected mode, the end-of-life judgment value EOL_para is refreshed by adding the number Release_Blk.

In an exemplary embodiment, each entry of the logical-to-physical address mapping table H2F is stored with a physical address pointer directing to a physical page of a physical block. To break the logical-to-physical mapping relationship of the issued logical addresses Hi~Hj for space release, the controller 104 may modify the logical-to-physical address mapping table H2F to zero the entry (stored with a physical address pointer) corresponding to the issued logical addresses Hi~Hj, or, in another exemplary embodiment, the physical address pointer corresponding to the issued logical addresses may be redirected to an invalid physical space by the controller 104.

The power-off protection mapping table PoffProt is discussed in this paragraph. In the power-off protection mapping table PoffProt, flags for different logical addresses are recorded to show any unfinished dynamic capacity management procedure at any logical address. Referring to FIG. 1, once the controller 104 receives a request for dynamic capacity management in which a section of the logical addresses, Hi~Hj, is issued for space release, the controller 104 asserts the flag PoPk, corresponding to the issued logical addresses Hi~Hj, in the power-off protection mapping table PoffProt to an "ON" mode. The "ON" mode is maintained till the logical-to-physical address mapping table H2F, the write protection mapping table WriteProt and the end-of-life judgment value EOL_Para are all refreshed. After the logical-to-physical address mapping table H2F, the write protection mapping table WriteProt and the end-of-life judgment value EOL_Para are all refreshed, the controller 104 switches the flag PoPk to an "OFF" mode. In this manner, if a power failure event occurs during a dynamic capacity management request, the controller 104 will find an obtrusive "ON" mode of the flag PoPk recorded in the power-off protection table PoffProt. Accordingly, the controller 104 will resume the interrupted dynamic capacity management.

Figure 2:
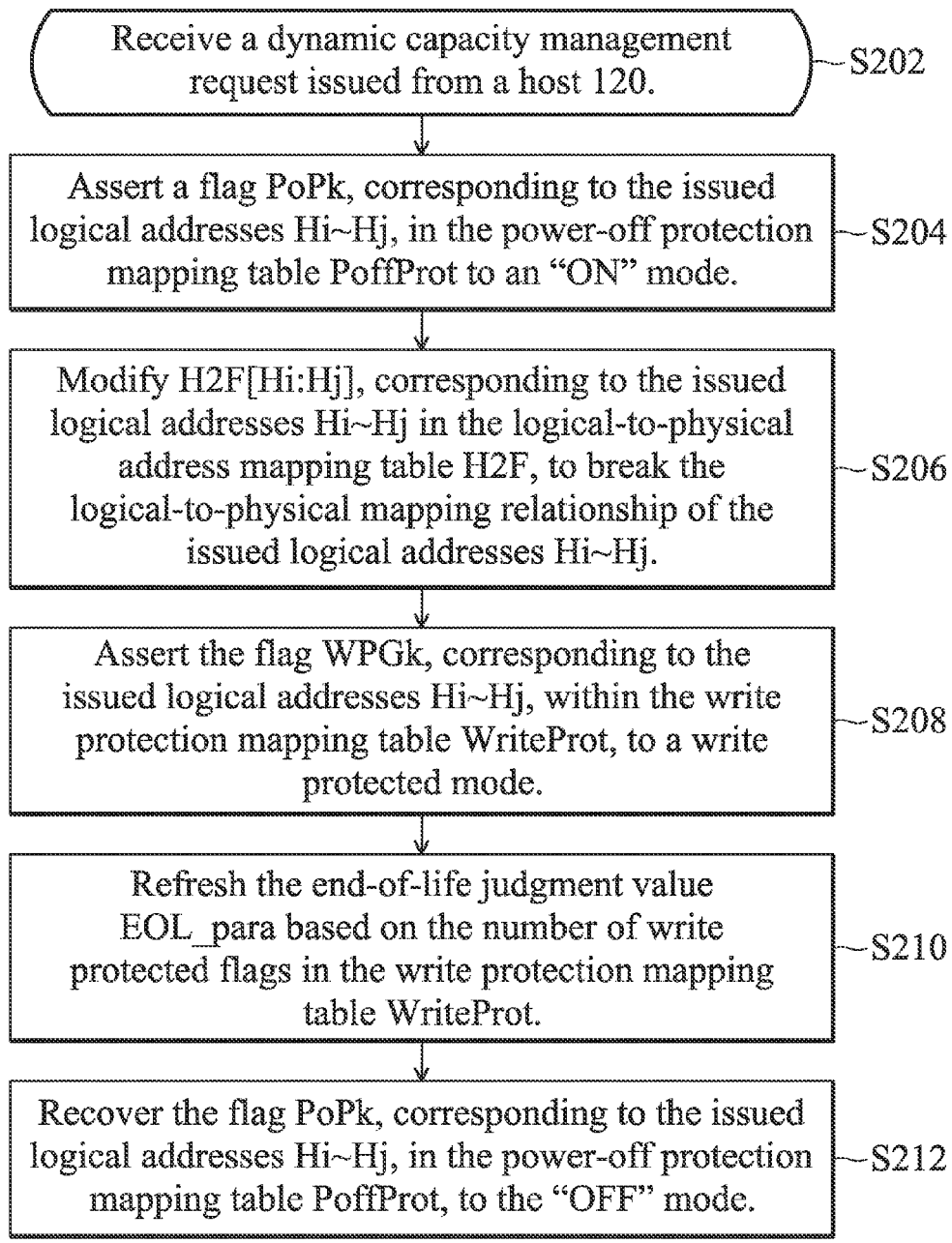
FIG. 2 is a flowchart depicting a FLASH memory control method in accordance with an exemplary embodiment of the invention.

FIG. 2 is a flowchart depicting a FLASH memory control method in accordance with an exemplary embodiment of the invention. The control method may be accomplished by firmware design, coded in the read only memory of the controller 104 or the FLASH memory 102 of FIG. 1, to be executed by a computing unit within the controller 104. Note that any technique controlling a FLASH memory in accordance with the FLASH memory control method of the disclosure should be considered to be within the scope of the invention. The FLASH memory control method depicted in FIG. 2 is discussed with reference to the hardware architecture of FIG. 1.

In step S202, a dynamic capacity management request issued from the host 120 is received. A section of the logical addresses, Hi~Hj, for space release is issued via the dynamic capacity management request. The issued logical addresses Hi~Hj corresponds to system data of the host 120 rather than user data for storage. In step S204, a flag PoPk, corresponding to the issued logical addresses Hi~Hj, in the power-off protection mapping table PoffProt is asserted to an "ON" mode. In step S206, the entries H2F[Hi:Hj], corresponding to the issued logical addresses Hi~Hj, within the logical-to-physical address mapping table H2F are modified to break the logical-to-physical mapping relationship of the issued logical addresses Hi~Hj. In step S208, the flag WPGk, corresponding to the issued logical addresses Hi~Hj, within the write protection mapping table WriteProt is asserted, to a write protected mode. In step S210, the end-of-life judgment value EOL_para is refreshed based on the number of write protected flags in the write protection mapping table WriteProt. In step S212, the flag PoPk, corresponding to the issued logical addresses Hi~Hj, in the power-off protection mapping table PoffProt is recovered to the "OFF" mode. Because the end-of-life value EOL_para is adjusted in accordance with the aforementioned steps, the lifespan of the FLASH memory 102 is prolonged and the FLASH memory 102 is kept writable. The optional power-off protection design in steps S204 and S212 improves the reliability of the device.

Figure 3:
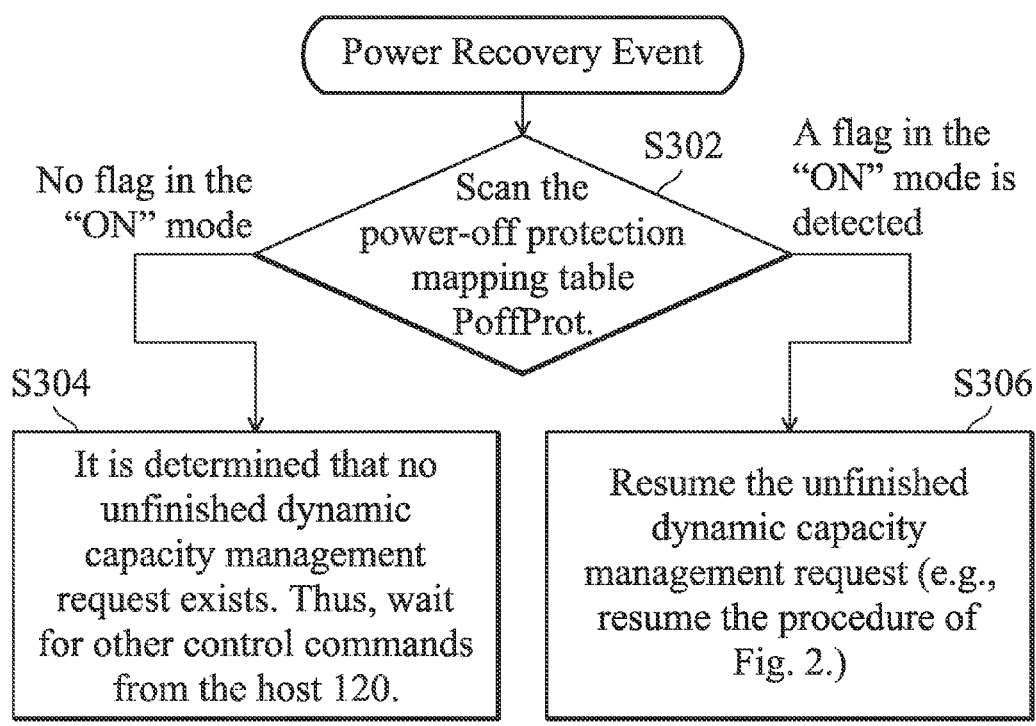
FIG. 3 is a flowchart depicting a FLASH memory control method for a power recovery event.

FIG. 3 is a flowchart depicting a FLASH memory control method for a power recovery event. In step S302, the power-off protection mapping table PoffProt is scanned. When there is no flag in the "ON" mode, step S304 is performed to wait for other control commands from the host 120 because there is no unfinished dynamic capacity management request. When it is determined in step S302 that there is a flag in the "ON" mode, the step S306 is performed to resume the interrupted dynamic capacity management request (e.g., resume the procedure of FIG. 2).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a FLASH memory, for data storage and further storing a logical-to-physical address mapping table and an access protection mapping table, wherein the access protection mapping table shows access protection statuses of different logical addresses; and
   a controller, setting a physical address pointer corresponding to issued logical addresses in the logical-to-physical address mapping table to zeros or redirecting the physical address pointer corresponding to the issued logical addresses in the logical-to-physical address mapping table to an invalid physical space in accordance with logical addresses issued via a dynamic capacity management request from a host to break a logical-to-physical mapping relationship of the issued logical addresses such that total amount of spare blocks available in the FLASH memory is increased, and, asserting a flag, corresponding to the issued logical addresses, in the access protection mapping table, to a access protected mode and, accordingly, adjusting an end-of-life judgment value,
   wherein the logical addresses issued via the dynamic capacity management request is modified as access-protected and thereby space allocation thereon is no more required, wherein the end-of-life judgment value is positively related to the total amount of spare blocks available in the FLASH memory.

2. The data storage device as claimed in claim 1, wherein the controller adjusts the end-of-life judgment value according to a change in the total amount of access protected flags in the access protection mapping table.

3. The data storage device as claimed in claim 2, wherein the controller determines whether the end-of-life judgment value is lower than a threshold value to determine whether the lifespan of the FLASH memory has expired.

4. The data storage device as claimed in claim 1, wherein the controller further stores a power-off protection mapping table into the FLASH memory to record any unfinished dynamic capacity management request.

5. The data storage device as claimed in claim 4, wherein the controller checks the power-off protection mapping table during a power restoration process to resume any unfinished dynamic capacity management request.

6. A FLASH memory control method, comprising:
   according to logical addresses issued via a dynamic capacity management request from a host, setting a physical address pointer corresponding to issued logical addresses in a logical-to-physical address mapping table to zeros or redirecting to an invalid physical space to break a logical-to-physical mapping relationship of the issued logical addresses such that total amount of spare blocks available in the FLASH memory is increased;
   asserting a flag, corresponding to the issued logical addresses, in an access protection mapping table stored in the FLASH memory, to a access protected mode, wherein the access protection mapping table shows access protection statuses of different logical addresses by flags; and
   adjusting an end-of-life judgment value based on the flags recorded in the access protection mapping table,
   wherein the logical addresses issued via the dynamic capacity management request is modified as access-protected and thereby space allocation thereon is no more required, wherein the end-of-life judgment value is positively related to the total amount of spare blocks available in the FLASH memory.

7. The FLASH memory control method as claimed in claim 6, wherein the end-of-life judgment value is adjusted in accordance with a change in the total amount of access protected flags in the access protection mapping table.

8. The FLASH memory control method as claimed in claim 7, further determining whether the end-of-life judgment value is lower than a threshold value to determine whether a lifespan of the FLASH memory has expired.

9. The FLASH memory control method as claimed in claim 6, further storing a power-off protection mapping table into the FLASH memory to record any unfinished dynamic capacity management request.

10. The FLASH memory control method as claimed in claim 9, further checking the power-off protection mapping table in a power restoration process to resume any unfinished dynamic capacity management request.

* * * * *